(12) United States Patent
Woodruff

(10) Patent No.: US 6,269,698 B1
(45) Date of Patent: Aug. 7, 2001

(54) VIBRATING BEAM FORCE SENSOR

(75) Inventor: James R. Woodruff, Redmond, WA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/340,559

(22) Filed: Jun. 28, 1999

Related U.S. Application Data
(60) Provisional application No. 60/126,164, filed on Mar. 25, 1999.

(51) Int. Cl.[7] ........................................... G01P 15/10
(52) U.S. Cl. ........................ 73/514.29; 73/862.59
(58) Field of Search .......................... 73/514.29, 862.59, 73/504.15, 504.16; 331/65, 156

(56) References Cited

U.S. PATENT DOCUMENTS

| | | | |
|---|---|---|---|
| 4,890,598 | 1/1990 | Kinsworthy | 126/110 D |
| 5,367,217 | * 11/1994 | Norling | 73/862.59 |
| 5,450,762 | 9/1995 | Woodruff et al. | 73/862.59 |
| 5,456,111 | 10/1995 | Hulsing, II | 73/514.32 |
| 5,717,140 | 2/1998 | Hulsing, II | 73/504.16 |

FOREIGN PATENT DOCUMENTS 0 840 128 A1   5/1998   (EP) .

* cited by examiner

*Primary Examiner*—John E. Chapman

(57) ABSTRACT

A mechanical resonator having interconnected vibrating beams and counter balances whereby transfer of energy from the vibrating beams is essentially eliminated.

24 Claims, 4 Drawing Sheets

*Fig. 2-A (PRIOR ART)*

VIBRATING BEAM FORCE SENSOR

This application claims the benefit of U.S. Provisional Application Ser. No. 60/126,164, filed in the name of James R. Woodruff on Mar. 25, 1999, the entire contents of which are incorporated herein by reference.

BACKGROUND OF THE INVENTION

The present invention relates generally to vibrating beams, including piezoelectric or silicon beams that may be piezoelectrically, electrostatically, electromagnetically, or thermally driven, and particularly to vibrating beams that are utilized as force sensors, for example, acceleration sensors or accelerometers. In particular, the present invention relates to a method and apparatus for reducing the forces transferred to the beam supporting structure to thereby improve the mechanical resonance amplification factor (Q) of the vibratory system.

A widely used technique for force detection and measurement in various mechanical resonators, including acceleration, and pressure sensors, employs one or more vibrating beams having a frequency of vibration which varies as a function of the force applied. An electrostatic, electromagnetic, piezoelectric or thermal force is applied to the beams to cause them to vibrate transversely or in various other modes at a resonant frequency. The resonant frequency of such a beam is raised when subjected to tension and lowered when subjected to compression. The mechanical resonator is designed so that the physical quantity to be measured results in tension or compression of the vibrating beam or beams, whereby the vibration frequency of the beam or beams is a measure of the amplitude of the quantity being measured. In one such mechanical resonator, one or more elongate vibrating beams are coupled between an instrument frame and a proof mass suspended by a flexure to measure acceleration. Acceleration force applied to the proof mass along a fixed axis causes tension or compression of the beams, which varies the frequency of the vibrating beams. The force applied to the proof mass is quantified by measuring the change in vibration frequency of the beams.

Recently, mechanical resonators have been fabricated from a body of semiconductor material, such as silicon, by micromachining techniques. For example, one micromachining technique involves masking a body of silicon in a desired pattern, and then deep etching the silicon to remove portions thereof. The resulting three-dimensional silicon structure functions as a miniature mechanical resonator device, such as an accelerometer that includes a proof mass suspended by a flexure. Existing techniques for manufacturing these miniature devices are described in U.S. Pat. No. 5,006,487, METHOD OF MAKING AN ELECTROSTATIC SILICON ACCELEROMETER and U.S. Pat. No. 4,945,765, SILICON MICROMACHINED ACCELEROMETER, the complete disclosures of which are incorporated herein by reference.

In electrostatically driven mechanical resonators, the elongate beam(s) are typically vibrated by a drive electrode(s) positioned adjacent to or near each beam. A drive voltage, e.g., alternating current, is applied to the drive electrode(s) in conjunction with a bias voltage to generate an electrostatic force that vibrates the beam(s) at a resonant frequency. Motion of the beam(s), in turn, generates a current between the electrode and the beam(s) to produce an electrical signal representing the vibration frequency of the beam. Typically, high bias voltages are considered desirable because the current signal from the charging capacitance is proportional to the bias voltage. Therefore, increasing the bias voltage increases the signal to noise ratio of the resonator such that less amplifier gain is required for the oscillator circuit.

Another important consideration in the manufacture of miniature vibratory force sensing mechanical resonators is to minimize variations in the frequency signal from the vibrating beams, except for frequency variations responsive to the applied force. To that end, manufacturers of these devices typically strive to maximize the resonance amplification factor (Q) of the vibrating beams, which generally represents the sharpness of the resonances. The resonance amplification factor, or Q, is typically maximized by partially or completely evacuating the chamber surrounding the mechanical resonator to reduce viscous damping of the resonator beams. Thus, mechanical resonators ideally operate in a vacuum to increase the Q and thereby increase the signal-to-noise ratio of the mechanical resonator.

Various transducers, including accelerometers, utilize one or more vibrating beams that vibrate laterally in the plane of the beams or in various other modes. The resonant frequency of such a beam or beams is raised when the beam is subject to tension and lowered when subjected to compression. The transducer is designed so that the physical quality to be measured results in application of tension or compression to the vibrating beam or beams so that the frequency of vibration of the beam or beams is a measure of the amplitude of the quantity being measured. The performance of a vibrating beam is also degraded if energy is transferred from the beam to other structures, for example, the beam supporting structure, through rotational and transverse forces at the ends of the beam. Such mechanical coupling between the beam and the supporting structure can lower the Q of the beam and cause undesirable frequency shifts. One prior art method used a double-ended tuning fork having multiple beams vibrating out of phase to cancel rotational and transverse forces to reduce the energy transfer from the beam. The double-ended tuning fork utilizes two or more beams located side-by-side vibrating in opposite directions to cancel the forces appearing at the ends of the beams. The out of phase vibrations of the double-ended tuning fork set up equal and opposite reaction forces in the supporting structure at the ends of the beams which cancel. Examples of multiple beam resonators used to reduce energy transfer to the supporting structure are disclosed in U.S. Pat. No. 4,215,570; U.S. Pat. No. 4,372,173; U.S. Pat. No. 4,415,827 and U.S. Pat. No. 4,901,586, the complete disclosures of which are incorporated herein by reference.

Another prior art approach used vibration isolators between the ends of the beams and the supporting structure to reduce the transfer of energy from the beam to the mounting structure. Such isolators usually have an isolation mass at each end of the vibrating beam and a resilient member between each isolation mass and the supporting structure. The resilient members permit the beam and the isolator masses to move relative to the supporting structure, whereby the amount of energy transferred from the vibrating beam to the supporting structure is reduced. The isolation systems are most effective when the isolator masses are large and the isolation springs are compliant. Such large isolator masses and compliance springs result in a low resonant frequency for the isolation system which is undesirable, particularly in accelerometer applications. In addition, isolation systems attenuate the reaction forces generated in the supporting structure, but cannot completely eliminate them.

U.S. Pat. No. 5,450,762, REACTIONLESS SINGLE BEAM VIBRATING FORCE SENSOR, the complete disclosure of which is incorporated herein by reference, provides yet another approach using a counter balance structure at the each end of the vibrating beam to cancel rotational and transverse forces appearing at the ends of the beam, whereby the transfer of energy from the beam to the mounting structure is reduced. The counter balances move in directions opposite to the ends of the beam in order to cancel both rotational moments and transverse forces normal to the longitudinal axis of the beam, i.e. moment and shear forces at the ends of the beam. The action of the counter balance generates equal and opposite reaction forces within the beam that cancel the moment and shear forces internally. Therefore, in contrast to the double-ended tuning fork, the counter-balanced beam transmits no energy into the supporting structure and no reaction force is developed within the supporting structure which must be cancelled by an equal and opposite force. The counter balances are configured relative to the beam to completely cancel only one of either the rotational moments or the transverse forces at the ends of the beam. When one of these forces is cancelled, there remains a residual amount of the other. The counter balance is intended to provide an optimal balance between the amounts of residual transverse force and rotational moment for a particular application. U.S. Pat. No. 5,450,762 also discloses a flexure interposed between the ends of the vibrating beam and the support structure which is intended to reduce the amount of residual torque applied to the mounting structure.

The vibrating beam in the counter-balanced vibrating beam force sensors preferably or necessarily has particular values of four characteristics: (1) beam resonant frequency, (2) longitudinal stiffness, (3) sensitivity to force, and (4) strength. Beam design controls the values of these four characteristics. Often, the manufacturing process makes thickness variation of the beam impractical. Therefore, two dimensions, length and width, are typically chosen to control these four characteristics. While the single counter balanced vibrating beam force sensor of the prior art, shown and described below in FIG. 2, was configurable such that values of the four characteristics of beam frequency, longitudinal stiffness, force sensitivity, and strength, were satisfactory for prior art sized proof masses, shown and described in FIG. 1, some system designs have requirements demanding a larger proof mass. Experience has shown that a larger mechanism with a larger proof mass is less susceptible to interference from various sources and is therefore more stable.

The moment of inertia of the pendulous proof mass and the force from acceleration both increase linearly with the width of the proof mass, while the force from acceleration increases with the square of the length and the moment of inertia increases with the cube of the length. Increasing the moment of inertia causes an undesirable increase in the pendulous proof mass/flexure system resonant frequency. Therefore, the preferred method of increasing the proof mass is to increase its width without changing its length. Such increases in the dimensions of the pendulous proof mass require dimensional changes in the vibrating beams to achieve satisfactory performance. Again, processing constraints do not generally permit changing the thickness of the beams and the four characteristics of resonant frequency, sensitivity to force, strength, and longitudinal stiffness vary differently and independently with variation of the beam dimensions such that control of the four characteristics is often unsatisfactory by mere manipulation of the length and width dimensions.

Generally, satisfactory performance of a mechanism having a proof mass of increased dimensions requires vibrating beams having a force sensitivity reduced in proportion to an increase in the moment of inertia of the proof mass about the bending or hinge axis of the flexure, a strength and longitudinal stiffness increased in proportion to an increase in the moment of inertia, and an unchanged resonant frequency. The resonant frequency of a vibrating beam is proportional to its width and inversely to the square of its length; force sensitivity is inversely proportional to the cube of its width and directly proportional to the square of its length; strength is proportional to its width; and longitudinal stiffness is proportional to its width and inversely proportional to its length. Due to the differently and independently varying nature of the four characteristics with variation of the chosen dimensions of the vibrating beams, no combination of the width and length dimensions result in satisfactory values of the four characteristics for a proof mass of size increased over that of the prior art.

U.S. Pat. No. 5,367,217, the complete disclosure of which is incorporated herein by reference, provides a four bar double-ended tuning fork device wherein two outer beams vibrate out of plane with two inner beams. According to one embodiment, the two inner beams are joined by one or more bridge members extending between the two beams in order to synchronize their motion and eliminate undesirable modes of operation. The four bar resonator operates similarly to the standard double-ended tuning fork described above, except that the beams vibrate out-of-plane rather than in-plane or laterally. The structure taught cannot be adapted to an in-plane resonator and is therefore not applicable to the problems of in-plane. Nor can the four bar out-of-plane resonator be combined with other structures taught in the prior art to solve the problems posed by an instrument having an in-plane resonator coupled to a proof mass of size increased over that of the prior art.

SUMMARY OF THE INVENTION

The invention recognizes and accounts for the fact that the values of the four vibrating beam characteristics (1) beam frequency, (2) longitudinal stiffness, (3) force sensitivity, and (4) strength, vary differently and independently with variations of the controlling dimensions of the vibrating beams, and that no combination of the width and length dimensions result in satisfactory values of the four characteristics for a proof mass of size increased over that of the prior art.

The present invention provides methods and apparatus for achieving a vibrating beam mechanical resonator having satisfactory characteristics when used with a pendulous proof mass of size significantly increased over that of the prior art for detecting and measuring forces. These methods and apparatus are useful in a variety of applications, and they are particularly useful for measuring acceleration.

According to one aspect of the present invention, the present invention includes various embodiments which overcome the problems of the prior art by providing a mechanical resonator having a pair of vibrating beams interconnected at a point approximately half-way along the length of the beams with one end of each vibrating beam interconnected to a support structure for detecting a force applied thereto, and counter balances extending from each vibrating beam, whereby transfer of force at said interconnected end of each vibrating beam to the support structure is essentially eliminated for beams vibrating in the plane of the support structure. The present invention provides counter balance structures disposed at each end of the vibrating beams and a joining member extending between the vibrating beams for mechanically joining or coupling the beams such that they vibrate in unison. The counter balance and mechanical interconnection act in combination to internally cancel forces normally appearing at the ends of the beam, including both rotational moments and transverse forces normal to the longitudinal axis of the beam. The combination counter balance and mechanical interconnection completely cancel only one of these forces, either the rotational moments or the transverse, i.e. shear, forces. As in the prior art device described in above incorporated U.S. Pat. No. 5,450,762, when one of these forces is cancelled, there remains a residual amount of the other. However, the combination counter balance and mechanical interconnection provides an optimal balance between the amounts of residual transverse force and rotational moment while maximizing the resonance amplification factor (Q) of the vibrating beams for a particular application wherein the proof mass size is significantly increased over that of the prior art.

According to still another aspect of the present invention, the present invention further provides various physical embodiments in which the support structure includes a frame and a proof mass pliantly suspended therefrom with the vibrating beams being coupled to both the proof mass and the frame for detecting a force applied to the proof mass.

In a preferred embodiment, the vibrating beam mechanical resonator includes multiple fingers intermeshed with fingers projecting from an electrode which are coupled to an oscillating circuit for electrostatically vibrating the beams in a substantially lateral direction.

According to another aspect of the present invention, the invention provides methods for eliminating the transfer of energy from a mechanical resonator to a supporting structure thereof, whereby rotational moment and transverse or shear forces at the ends of the beams are substantially eliminated while the resonance amplification factor (Q) of the vibrating beams is maximized. One such method includes mechanically coupling one end of a pair of vibrating beams to the supporting structure for detecting a force applied thereto, mechanically interconnecting the vibrating beams at a point about half-way along their length, and counter balancing each of the vibrating beams. The counter balances are configured relative to the interconnected beams to completely cancel only one of these forces, either the rotational moments or the transverse forces.

According to still another aspect of the present invention, the invention provides a method for substantially eliminating the transfer of energy from a mechanical resonator in which counter balancing the beams includes outwardly extending a counter balancing member from each end of the beams. In a preferred embodiment, the counter balancing aspect of the method includes counter weighting each outwardly extending counter balancing member.

DETAILED DESCRIPTION OF THE PREFERRED EMBODIMENTS

In the Figures, like numerals indicate like elements.

Figure 1:
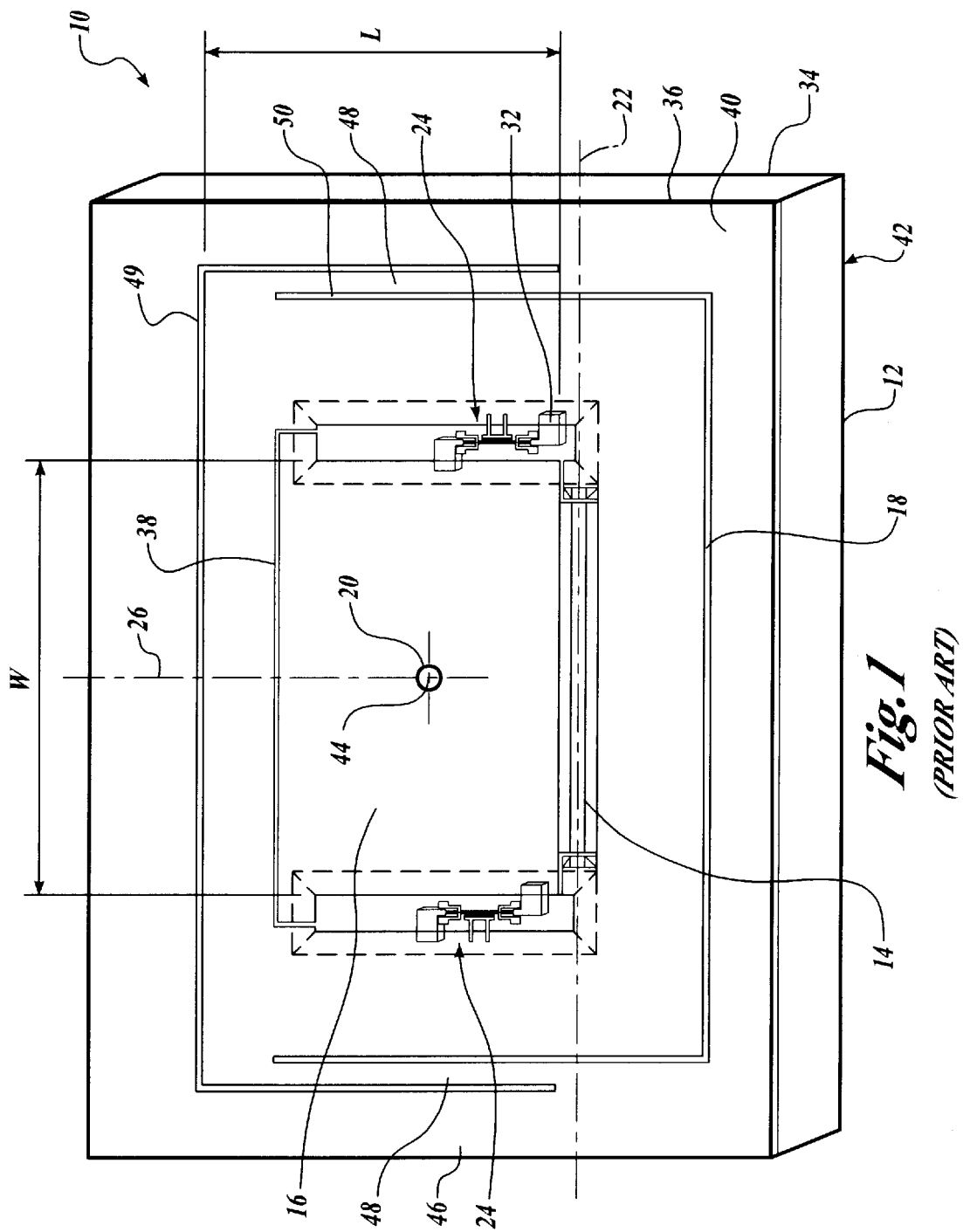
FIG. 1 illustrates a representative miniature force detecting system or accelerometer according to the prior art formed of a semiconductor substrate by conventional micromachining techniques.

FIG. 1 shows a representative force detecting system or accelerometer 10 is illustrated according to the prior art as illustratively described in essential detail in above incorporated U.S. Pat. No. 5,450,762 in combination with U.S. Pat. No. 5,948,981, in the name of the inventor of the present invention and assigned to the assignee of the present application, the complete disclosure of which is hereby incorporated herein by reference. Accelerometer 10 is a miniature structure fabricated from a substrate 12 of semiconductor material by conventional micromachining techniques. Substrate 12 is preferably formed of a monocrystalline silicon material. Accelerometer 10 includes one or more flexures 14 pliantly suspending a proof mass 16 from a frame 18 for movement of the proof mass 16 along an input axis 20. Flexures 14 define a hinge axis 22 about which proof mass 16 moves in response to an applied force, such as the acceleration of the vehicle, aircraft or other moving body having the accelerometer 10 mounted thereon. Proof mass 16 has width dimension W measured along hinge axis 22 and a length dimension L measured along a pendulous axis 26 perpendicular to hinge axis 22 and extending between flexure 14 and the free end of proof mass 16 opposite flexure 14. Accelerometer 10 includes a pair of mechanical resonators 24 coupled to proof mass 16 and to frame 18 for measuring forces applied to proof mass 16 by means discussed in detail below. An oscillator circuit 30, shown and described in detail below and in above incorporated U.S. Pat. No. 5,948,981, electrostatically drives mechanical resonators 24 at their resonance frequency. In response to an applied force, mass 16 rotates about hinge axis 22, causing axial forces, either compressive or tensile, to be applied to mechanical resonators 24. The axial forces change the frequency of vibration of mechanical resonators 24 and the magnitude of this change serves as a measure of the applied force.

Silicon substrate 12 includes an upper silicon or active layer 32 electrically isolated from an underlying substrate 34 by an insulating layer 36 applied to underlying substrate 34, as shown and described in detail in above incorporated U.S. Pat. No. 5,948,981. Alternatively, an insulating layer is applied to active layer 32, as shown and described in above incorporated U.S. Pat. No. 5,948,981. Insulating layer 36 is preferably a thin layer, e.g., about 0.1 to 10.0 micrometers, of oxide, such as silicon oxide. Silicon substrate 12 is usually formed by oxidizing active layer 32 and underlying substrate 34, and then adhering the two layers together. A portion of active layer 32 is removed to bring layer 32 to the desired thickness. Silicon oxide layer 36 retains its insulating properties over a wide temperature range to ensure effective mechanical resonator performance at, for example, high operating temperatures on the order of above about 70 to 100 degrees Celsius. In addition, insulating layer 36 inhibits undesirable etching of the active layer while the substrate is being etched, as discussed in detail in above incorporated U.S. Pat. No. 5,948,981.

Proof mass 16 is typically formed from underlying substrate 34 by etching a slot 38 through substrate 12 and suitably etching around flexure 14. Mechanical resonators 24 and appropriate electrical bonds (not shown) for coupling mechanical resonators 24 to an oscillator circuit 30 are formed on active layer 32 by suitable etching techniques, such as reactive ion etching, anisotropic etching or the like. Preferably, the electrical bonds are directly coupled to oscillator circuit 30. If desired, the remaining portions (not shown) of active layer 32 are removed to minimize disturbances to the active components.

Flexure 14 is preferably etched near or at the center of the underlying substrate 34, i.e., substantially centered between upper and lower surfaces 40, 42. Preferably, flexure 14 is formed by anistropically etching the flexures in a suitable etchant, such as potassium hydroxide (KOH). This arrangement ensures that center of gravity 44 of accelerometer 10 is placed with a high degree of precision upon the center axis of underlying substrate 34, whereby input axis 20 is substantially normal to the plane of substrate 12, which in turn ensures that input axis 20 is essentially perpendicular to the plane of proof mass 16. Preferably, flexure 14 is designed to exhibit simple bending motion and to limit S-bending motion. Accordingly, flexure 14 is preferably formed with a relatively short length. Alternatively, flexure 14 is formed of two or more flexures (not shown) arranged to pliantly suspend proof mass 16 from frame 18 for rotation about hinge axis 22, as shown and described in above incorporated U.S. Pat. No. 5,948,981.

According to one preferred embodiment, frame 18 is isolated from external stresses caused by, for example, external sources of shock and vibration applied to the sensor or thermal stresses caused by a mismatch of coefficients of thermal expansion between materials of the sensor. External stresses and strains may be induced by, for example, the typical mechanical coupling of frame 18 to a silicon cover plate (not shown), which, in turn, is typically connected to a ceramic or metal mounting plate (not shown). Since the mounting and cover plates are fabricated from different materials, they will usually have substantially different coefficients of thermal expansion when heated. This mismatch in thermal coefficients may cause undesirable stresses and strains at the interface of the inner and cover plates, causing a slight distortion of frame 18. Many methods of isolating accelerometer 10 from Such undesirable stresses and strains are known to those of ordinary skill in the relevant arts. For example, suspending accelerometer frame 18 from a second outer frame 46 by flexures 48 formed by overlapping slots 49 and 50 through substrate 12, whereby accelerometer frame 18 is able to move relative to the outer frame 46, as shown and described in above incorporated U.S. patent application Ser. No. 08/735,299. Such isolation minimizes the distortion of accelerometer frame 18 and thereby decreases the effects of thermal mismatching on mechanical resonators 24.

Electrostatic Comb Drive

Figure 2:
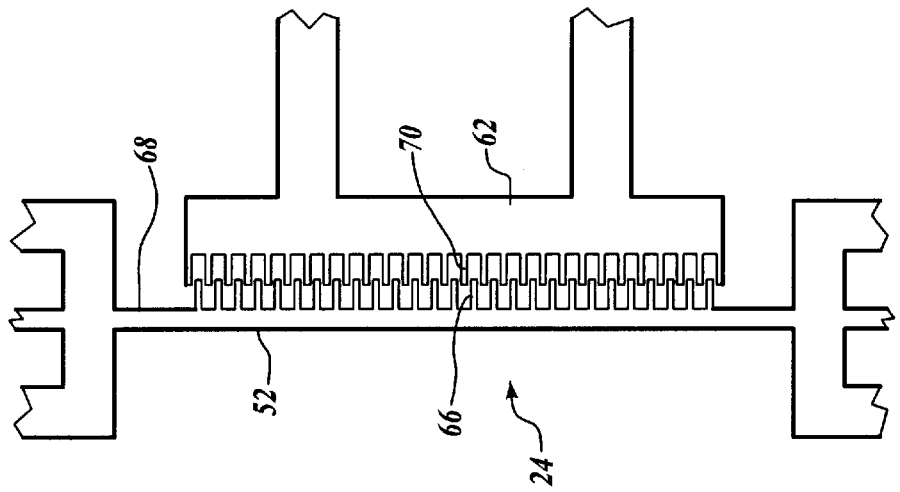
FIG. 2 illustrates an electrostatically driven mechanical resonator of the prior art, FIG. 2 includes FIG. 2A which is an enlarged view of the electrostatically driven mechanical resonator shown in FIG. 2.
Figure 2:
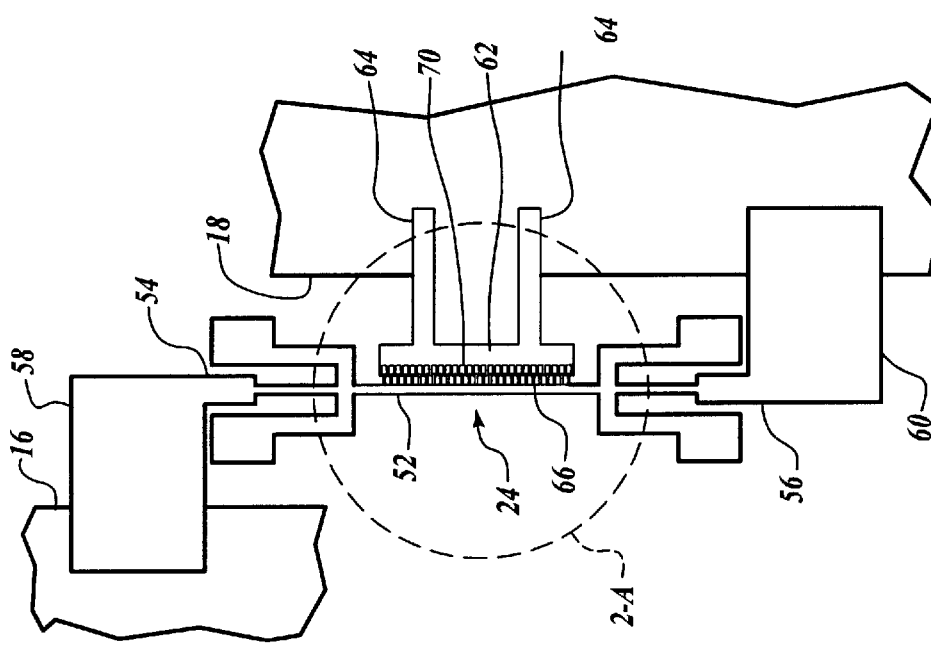

FIG. 2 illustrates the prior art electrostatically driven mechanical resonators 24. Mechanical resonator 24 is formed with one or more elongate beams 52 mounted to enlarged or widened end supports 54, 56. Beam 52 is formed from active silicon layer 32 and separated from underlying substrate 34 so that beam 52 may be vibrated laterally relative to fixed end supports 54, 56. End supports 54, 56 are suitably bonded to proof mass 16 and frame 18, respectively, by mounting pads 58, 60.

Mechanical resonators 24 each further include an electrostatic drive for laterally vibrating beam 52 at its resonance frequency. The electrostatic drive includes an elongate electrode 62 located on one side of beam 52. Electrode 62 is generally parallel to and laterally spaced from beam 52, as shown and described in above incorporated U.S. patent application Ser. No. 08/735,299. Electrode 62 is preferably etched from active layer 32 and doped with a suitable conductive material to create the necessary charge carriers and to facilitate completion of the electrical circuit. Alternatively, electrode 62 is formed from an electrically conductive material deposited by conventional manufacturing methods on the surface of active layer 32. The conductive material is preferably gold which is a relatively stable material readily deposited by conventional sputtering or deposition methods.

Electrode 62 is supported by a pair of support arms 64 extending laterally away from beam. One support arms 64 on electrode 62 is coupled to a bonding pad (not shown) for electrically coupling electrode 62 to oscillation circuit 30. Another mounting pad (not shown) electrically couples beam 52 to oscillation circuit 30 to complete the electrical circuit with electrode 62 and beam 52. Details illustrating the electrical interconnections of beam 52 and electrode 62 to oscillation circuit 30 are shown and described in above incorporated U.S. patent application Ser. No. 08/735,299. Underlying substrate 34 may also include a bonding pad (not shown) for electrically connecting substrate 34 to ground. Bonding pads are typically formed from a suitable conductive material, such as gold.

As shown more clearly in FIG. 2A, beam 52 includes a plurality of fingers 66 projecting outward from a lateral surface 68 of beam 52 toward corresponding electrode 62. Likewise, electrode 62 includes a plurality of fingers 70 projecting laterally inward so that beam fingers 66 and electrode fingers 70 are intermeshed with each other. Fingers 66, 70 are each sized so that their ends 72 will not contact beam 52 or electrode 62 when beam 52 is laterally vibrated relative to electrode 62. Usually, fingers 66, 70 will have a length of about 20 to 60 microns, preferably about 35 to 45 microns, so that fingers 66, 70 overlap each other in the lateral direction by about 2 to 10 microns. Electrode fingers 70 and beam fingers 66 are axially spaced from each other by a suitable distance to provide electric capacitance therebetween. Usually, beam and electrode fingers 66, 70 are spaced by about 2 to 10 microns from each other and preferably about 4 to 8 microns. Since beam fingers 66 are axially spaced from electrode fingers 70, the distance between fingers 66, 70 generally remains constant as beam 52 vibrates in the lateral direction.

Electrostatic force is generally proportional to the square of the charge; the charge is in turn proportional to the voltage and to the capacitance between the beam and the electrode. The capacitance is inversely proportional to the distance between the beam and the electrode. Accordingly, the electrostatic force is proportional to the square of the voltage and inversely proportional to the square of the distance between the beam and the electrode. Thus, changes in the distance between the beam and the electrode will typically change the electrostatic force. In fact, this change in the electrostatic force often acts as an electrical spring that works opposite to the elastic force or mechanical spring of the beam to lower the resonance frequency. For example, as the beam moves from its rest position closer to the electrode, the electrostatic force increases, the change in force working opposite to the elastic force of the beam. When the beam moves from its rest position away from the electrode, the electrostatic force decreases, so that the change in electrostatic force again works against the elastic restoring force of the beam. This lowers the resonance frequency of the beam by a factor related to the magnitude of the bias voltage. Accordingly, the resonant frequency of the beams is generally sensitive to changes in the bias voltage.

As shown and described in above incorporated U.S. patent application Ser. No. 08/735,299, the distance between intermeshed beam and electrode fingers 66, 70 remains substantially constant as beam 52 vibrates relative to stationary electrode 62. The electrostatic force between the beam and the electrode is generally proportional to the change in capacitance with distance. Since the capacitance between the intermeshed electrode and beam fingers changes linearly with the motion of the beams, the electrostatic force remains substantially constant as the beams move toward and away from the electrodes. Accordingly, the electrostatic force remains substantially constant during vibration of beam 52 and, therefore, does not work against the mechanical spring of beam 52 to lower the resonance frequency. Thus, the sensitivity to changes in bias voltage is decreased by 5 to 10 times compared to a similar resonator that does not incorporate intermeshed fingers. Reducing the sensitivity of the resonance frequency to changes in bias voltage increases the accuracy of the mechanical resonator. As a result, the mechanical resonator operates effectively with higher bias voltage levels, which results in a larger signal-to-noise ratio and requires less amplifier gain in the oscillator circuit. Usually, a bias voltage of about 5 to 100 Volts is applied to electrode 62 and beam 52, preferably at least 50 Volts will be applied to the electrodes and beam.

Forces applied to proof mass 16 cause it to rotate about hinge axis 22. This rotation generates an axial force against mechanical resonators 24. The axial force applied to mechanical resonators 24 proportionally changes the vibration frequency of beam 52 in each mechanical resonator 24. A relatively high resonance amplification factor (Q) makes the vibration frequency of the beam less sensitive to manufacturing tolerances, variations in the electronic components of the oscillator circuit, and other inputs apart from variations in the physical quantity to be measured. Therefore, maximization of the Q of mechanical resonators 24 is generally considered beneficial. Typically, Q is maximized by partially evacuating accelerometer 10 to reduce damping of beam 52 because the air between the moving beam 52 and the electrode 62 damps the movement of beam 52 toward electrode 62. On the other hand, gas damping of proof mass 16 is also desirable to minimize vibrations of proof mass 16 unrelated to an applied force. For example, a force applied to proof mass 16 in a vacuum or near vacuum causes proof mass 16 to continuously swing back and forth about inner flexure 14 until eventually slowed to a halt by internal damping forces. Undesirable resonance caused by vibrations in the surrounding environment, other than the applied force, cause the proof mass to oscillate. Gas damping of proof mass 16 minimizes these undesirable oscillations.

As shown and described in above incorporated U.S. patent application Ser. No. 08/735,299, intermeshed beam and electrode fingers 66, 70 decrease the damping of beam 52 at pressures above vacuum on the order of 5 to 10 times. In fact, mechanical resonators 24 of the prior art operate effectively in air having substantially higher pressure levels than vacuum, i.e., pressure levels on the order ¹/₁₀ to 1 atmosphere, because a portion of the air between beam 52 and electrode 62 is located in the axial gaps between beam and electrode fingers 66, 70. Since fingers 66, 70 are not moving toward and away from each other, this portion of the air contributes substantially less to the damping of beam 52. Accordingly, mechanical resonators 24 can be operated at atmospheric pressure, which allows proof mass 16 to be gas damped to minimize undesirable vibrations in the proof mass 16.

Internal Force Balance

Figure 3:
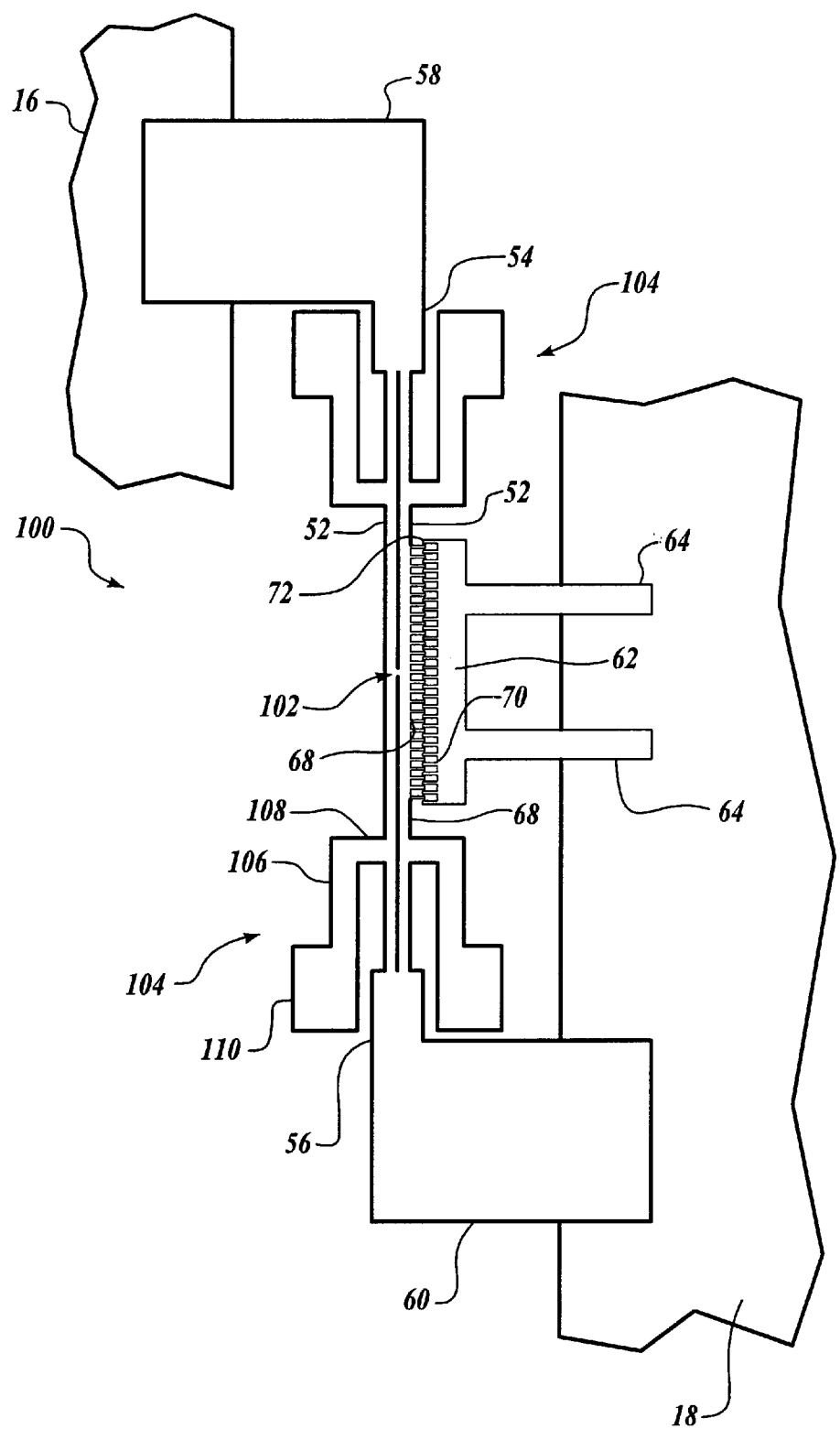
FIG. 3 illustrates a double balanced vibrating beam force sensor formed in accordance with the present invention.

FIG. 3 illustrates a double balanced vibrating beam force sensor 100 formed in accordance with the present invention having two counterbalanced vibrating beams. The vibrating beams are attached to one another at their approximate midpoint, or approximately halfway along their lengths, by a joining portion, where by the side-by-side beams are constrained to vibrate together. Compared to the prior art single beam sensor shown in FIGS. 1–2, double beam sensor 100 of the present invention shown in FIG. 3 has the desired values for each of the four characteristics: (1) beam frequency, (2) longitudinal stiffness, (3) force sensitivity, and (4) strength, whereby satisfactory performance is achieved when used with a proof mass sized significantly larger than the prior art sized proof masses. Classical mechanical analysis shows that, in the preferred embodiment, double beam sensor 100 of the present invention exhibits the same resonant frequency, one-half the force sensitivity, twice the longitudinal stiffness, and twice the strength as single beam mechanical resonator 24 of the prior art (shown in FIGS. 1–2), when coupled to a proof mass (not shown) having a width W twice as large as the prior art proof mass and an essentially identical length L.

The invention provides electrostatically driven mechanical resonator 100 formed with two or more elongate beams 52. Beams 52 are joined to end supports 54, 56. End supports 54, 56 are suitably bonded to proof mass 16 and frame 18, respectively, by mounting pads 58, 60. Elongate beams 52 are joined together at their approximate midpoint, or approximately halfway along their lengths, by joining portion 102, whereby beams 52 are constrained to move together laterally. Elongate beams 52, thus constrained to vibrate transversely together, vibrate at essentially the same natural resonant frequency in the plane of end supports 54, 56 as either beam vibrating singly. The natural resonant frequency, $f_n$, of a beam is proportional to its cross-sectional area according to:

$$f_n \approx bh^3/12, \quad (1)$$

where: b=the beam thickness; and
h=the beam height measured in the force input axis.
Thus, it can be shown that two elongate beams 52 interconnected by joining portion 102 have essentially half the characteristic sensitivity to force, twice the characteristic strength, and twice the characteristic longitudinal stiffness of any single beam configured with the same length, width and thickness dimensions and that the interconnected beams have essentially the same characteristic natural resonant frequency as that of the single beam. Therefore, two interconnected beams suspended from a large proof mass have essentially the same response to an applied force as an identical single beam suspended from a proof mass half the size.

Each beam 52 are preferably formed from active silicon layer 32 and separated from substrate 34 so that beams 52 may be vibrated laterally relative to fixed end supports 54, 56. Each beam 52 includes two counter balances 104 disposed at opposite ends of beams 52. Each counter balance 104 includes an outwardly extending member 106 that extends beyond the end of beam 52. Outwardly extending member 106 is supported from beam 52 by a spacer 108 that holds outwardly extending member 106 in a spaced relationship with beam 52. The spacing between outwardly extending member 106 and beam 52 is sufficiently large to prevent contact between outwardly extending member 106 and fixed end supports 54, 56 disposed at the extreme ends of each beam 52 during vibration. Each counter balance 104 further includes an optional counter weight portion 110 sized to cancel the rotational moments or transverse forces appearing at the ends of beam 52. Alternatively, outwardly extending member 106 is sized to cancel the rotational or transverse forces without including optional weight portion 110.

Each counter balance 104 is positioned along beam 52 at a point that rotates as the beam vibrates. Outwardly extending members 106 of counter balances 104 extend in a direction such that part of the motion of each counter balance 104 caused by the rotation of the section of beam 52 to which it attaches is in a direction opposite to that of beam 52, whereby the forces normally generated at the ends of beam 52 are internally cancelled by the equal and opposite forces generated by counter balance 104. The proportions of outwardly extending member 106, spacer 108, and optional weight portion 110 are selected relative to the dimensions of beam 52 such that one of the rotational moment and the transverse forces at the ends of the beam are internally cancelled, although a residual amount of the other force remains. Choices of beam support length and proportions of outwardly extending member 106, spacer 108, and optional weight portion 110 relative to the size of beam 52 are determined for each particular application. The choices depend in part upon the characteristics of the device in which the mechanical resonator is used. For a pendulous accelerometer, for example, the forces on the proof mass suspension from forces and moments at that ends of the beam support would be considered along with linear and angular stiffness of the proof mass suspension in various directions.

Mechanical resonator 100 further includes an electrostatic drive for laterally vibrating beams 52 at the resonance frequency of mechanical resonator 100. In the example shown in FIG. 3, only one beam 52 is electrostatically driven. The electrostatic drive includes an elongate electrode 62 located on one side of beam 52. Electrode 62 is generally parallel to and laterally spaced from beam 52, as shown and described above and in above incorporated U.S. patent application Ser. No. 08/735,299. Electrode 62 is preferably etched from active layer 32 and doped with a suitable conductive material to create the necessary charge carriers and to facilitate completion of the electrical circuit as described above. Again, electrode 62 is alternatively formed from an electrically conductive material, such as gold, deposited by conventional manufacturing methods on the surface of active layer 32. Electrode 62 is supported by a pair of support arms 64 extending laterally away from beam. Electrode 62 and beam 52 are electrically coupled to complete an electrical circuit with oscillation circuit 30 as described above and in above incorporated U.S. patent application Ser. No. 08/735,299.

One beam 52 includes plurality of fingers 66 projecting outward from a lateral surface 68 of beam 52 toward corresponding electrode 62 and intermeshing with plurality of fingers 70 projecting laterally inward toward beam 52. As described above and in above incorporated U.S. patent application Ser. No. 08/735,299, fingers 66, 70 are each sized so that their ends 72 will not contact beam 52 or electrode 62 when beams 52 are laterally vibrated relative to electrode 62. Fingers 66, 70 are axially spaced from each other by a suitable distance to provide electric capacitance therebetween, and the distance between fingers 66, 70 generally remains constant as beams 52 vibrate laterally. The constant electric capacitance between fingers 66, 70 ensures that the electrostatic force remains substantially constant during vibration of beams 52 and, therefore, does not work against the mechanical spring of beams 52 to lower the resonance frequency.

Oscillation Circuit

Figure 4:
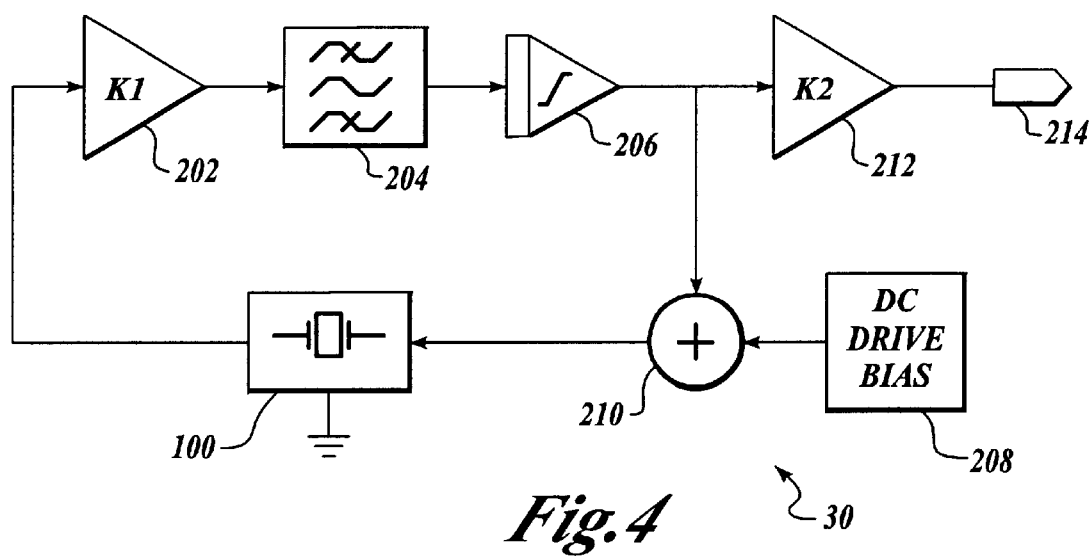
FIG. 4 illustrates a representative oscillation circuit in which a vibrating beam of functions as a resonator.

FIG. 4 illustrates a representative oscillation circuit 30 in which vibrating beam 52 of mechanical resonators 100 functions as a resonator. As shown and described in above incorporated U.S. patent application Ser. No. 08/735,299, a transimpedence amplifier 202 converts a sense current received from vibrating beam 52 to a voltage. This voltage is filtered by a bandpass filter 204, which reduces noise, and its amplitude is controlled by an amplitude limiter 204. The resulting signal is combined with the output or DC bias voltage from a DC source 208 in a summing junction 210. The DC bias voltage generates a force between electrode 62 and beam 52. The signal from amplitude limiter 204 modulates this force causing beam 52 to vibrate laterally at its resonant frequency. This lateral beam motion, in turn, generates the sense current. An output buffer 212 isolates the oscillator from external circuitry connected to an output 214 of oscillation circuit 30. The gain in oscillation circuit 30 sustains oscillation of beam 52.

Method of Manufacture

Figure 5A:
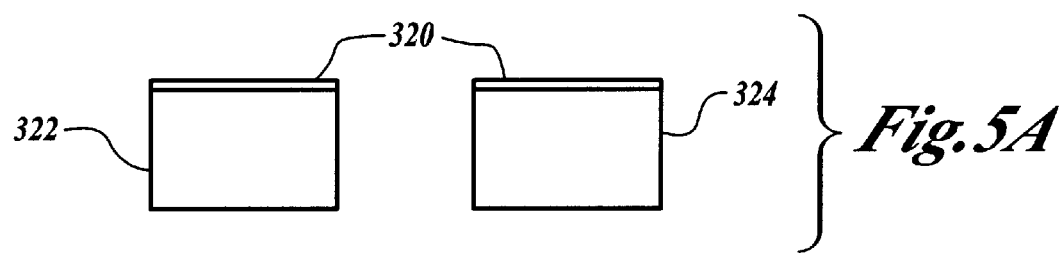
FIGS. 5A–5C show a method of manufacturing miniature force detecting, system or accelerometer according to the prior art, wherein an insulating layer of silicon oxide is first applied to an underlying substrate, active layer or both; silicon wafers are then placed together, preferably by molecular bonding at elevated temperatures; and, in a preferred configuration, portions of the silicon wafers are removed after they have been bonded together to provide an underlying substrate and a relatively thin active layer.
Figure 5B:
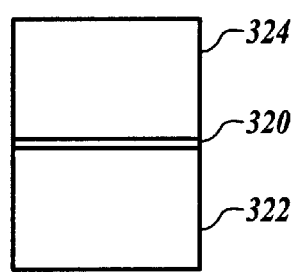
Figure 5C:
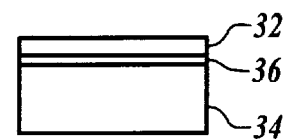

FIGS. 5A–5C show a method of manufacturing accelerometer 10 according to the prior art, as shown and described in above incorporated U.S. patent application Ser. No. 08/735,299. An insulating layer of silicon oxide is first applied to underlying substrate 34, active layer 32 or both. Preferably, an oxide layer 320 is epitaxially grown on substantially flat surfaces of silicon wafers 322, 324, as shown in FIG. 5A. Silicon wafers 322, 324 are then placed together, as shown in FIG. 5B, preferably by molecular bonding at elevated temperatures, e.g., on the order of about 300 to 500 degrees Celsius. In a preferred configuration, portions of silicon wafers 322, 324 are removed after they have been bonded together to provide underlying substrate 34 having a thickness of about 300 to 700 micrometers, preferably about 400 to 600 micrometers, and a relatively thin active layer 32 of about 5 to 40 micrometers, preferably about 10 to 30 micrometers, as shown in FIG. 5C.

Proof mass 16 and instrument frame 18 is then etched into underlying substrate 34 such that proof mass 16 is pliantly suspended from frame 18 by flexure 14 and mechanical resonators 100, including joining portion 102 and counter balances 104, are etched into active layer 32, as shown in FIG. 1. Insulating layer 36 inhibits undesirable etching of mechanical resonators 100 while underlying substrate 34 is being etched and vice versa. Vibrating beams 52 are etched, preferably with reactive ion etching, into the active layer 32. Electrodes 62 are etched from active layer 32 and doped with a suitable conductive material to create charge carriers and to facilitate completion of the electrical circuit. After the accelerometer components are formed into silicon wafers 322, 324, beams 52 are mechanically coupled to proof mass 16 and frame 18, and electrodes 62 are capacitively coupled to oscillator circuit 30.

Those of ordinary skill in the relevant art recognize that the present invention is not limited to the double balanced vibrating beam force sensor described above and shown in the Figures. For example, accelerometer 10 may incorporate a double ended tuning fork or a variety of other mechanical resonator arrangements. However, the double balanced vibrating beam arrangement is generally preferred, because the transfer of energy from the moving beams to the rest of the components in accelerometer 10 is minimized, which increases the effectiveness of the mechanical resonator.

Although the foregoing invention has been described in detail for purposes of clarity, it will be obvious that certain modifications may be practiced within the scope of the appended claims. For example, although the present invention is particularly useful for electrostatically driven resonators, it may also be used with other drive means, such as piezoelectric drives, electromagnetic drives, thermal drives or the like.

I claim:

1. A mechanical resonator comprising:
   a support structure;
   at least first and second vibrating beams interconnected at a point between first and second ends of said beams, one of said first and second ends of each said vibrating beam interconnected to said support structure;
   a counter balance extending from one side of each said vibrating beam opposite said interconnected point; and
   whereby transfer of energy at said interconnected end of each said beam to said support structure is essentially eliminated.

2. The mechanical resonator recited in claim 1, wherein said counter balance is configured to minimize transfer of rotational force at said interconnected end of each said beam.

3. The mechanical resonator recited in claim 1, wherein said counter balance is configured to minimize transfer of transverse force at said interconnected end of each said beam.

4. The mechanical resonator recited in claim 1, wherein said vibrating beams are interconnected at a point essentially intermediate between said first and second ends of said beams.

5. The mechanical resonator recited in claim 4, further comprising a joining portion extending between said vibrating beams at said interconnected point between said first and second ends of said beams.

6. The mechanical resonator recited in claim 5, wherein each said counter balance includes a pair of members extending outwardly from each of said first and second ends of said vibrating beams.

7. The mechanical resonator recited in claim 6, wherein each said member extends from said vibrating beams in a spaced parallel relation thereto.

8. The mechanical resonator recited in claim 7, wherein each said member further comprises a weight portion.

9. A mechanical resonator comprising:
   a pair of vibrating beams, each said beam having first and second ends;
   a support structure interconnected to one of said first and second ends of each said vibrating beam;
   a joining portion extending between said vibrating beams at a point between said first and second ends of said beams, said joining portion interconnecting said beams; and
   a counter balance extending from one side of each said vibrating beam opposite said joining portion at each said first and second ends,
   whereby forces at each said first and second end of each said beam transferred to said support structure is substantially zero.

10. The mechanical resonator recited in claim 9, wherein each said counter balance comprises an outwardly extending member in parallel relation to one of said beams.

11. The mechanical resonator recited in claim 10, wherein each said counter balance is coplanar with an associated one of said beams.

12. The mechanical resonator recited in claim 11, wherein each said beam and each said counter balance is formed in an epitaxial layer.

13. The mechanical resonator recited in claim 10, wherein each said counter balance further comprises a weight portion.

14. The mechanical resonator recited in claim 13, wherein each said weight portion extends outwardly and laterally of said outwardly extending member.

15. An apparatus for detecting an applied force, the apparatus comprising:
   a substrate comprising a semiconducting material and defining a frame;
   an active layer of semiconducting material comprising at least two vibrating beams interconnected at a point between first and second ends of said beams, said vibrating beams mechanically coupled to said frame for detecting a force applied thereto;
   a counter balance extending from one side of each said vibrating beam opposite said interconnecting point; and
   an insulating layer formed between the substrate and the active layer to insulate at least a portion of said vibrating beams from said substrate.

16. The apparatus recited in claim 15, wherein said interconnected point is located essentially intermediate between said first and second ends.

17. The apparatus recited in claim 16, further comprising a joining portion extending between said vibrating beams at said interconnected point and interconnecting said vibrating beams.

18. The apparatus recited in claim 17, wherein said substrate further comprises a proof mass suspended from said frame by one or more flexures, said vibrating beams being coupled to said proof mass and said frame for detecting a force applied to said proof mass.

19. The apparatus recited in claim 18, wherein at least one of said vibrating beams further comprises one or more fingers extending laterally outward from said beam; and
   the apparatus further comprising:
   an electrode comprising one or more fingers projecting laterally inward toward said beam and intermeshed with said beam fingers, and
   an oscillating circuit coupled to said electrode for electrostatically vibrating said beams in a substantially lateral direction.

20. The apparatus recited in claim 18, wherein said active layer comprises at least two pair of vibrating beams each coupled to an opposite side of said proof mass.

21. A method for eliminating the transfer of energy from a mechanical resonator to a supporting structure thereof, the method comprising:
   mechanically coupling first ends of a pair of vibrating beams to the supporting structure for detecting a force applied thereto;
   mechanically interconnecting said pair of vibrating beams at a point between said first ends and second ends; and
   counter balancing each of said vibrating beams by forming one or more counter balances on one side of each said vibrating beam opposite the other of said vibrating beams, whereby forces at the ends of the beams are substantially eliminated.

22. The method recited in claim 21, wherein said mechanical interconnecting point is disposed intermediate between said first ends and second ends.

23. The method recited in claim 22, wherein said counter balancing comprises outwardly extending a counter balancing member from each of said first ends and second ends.

24. The method recited in claim 23, wherein said counter balancing further comprises counter weighting each outwardly extending counter balancing member.

* * * * *